(12) United States Patent
Yeh et al.

(10) Patent No.: US 8,592,297 B2
(45) Date of Patent: Nov. 26, 2013

(54) WAFER AND METHOD OF PROCESSING WAFER

(75) Inventors: Tung-Ti Yeh, Tainan (TW); Wu-Chang Lin, Taichung (TW); Chung-Yi Huang, New Taipei (TW); Ya Wen Wu, Kaohsiung (TW); Hui-Mei Jao, Tainan (TW); Ting-Chun Wang, Tainan (TW); Chia-Hung Chung, Shanhua Township (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 62 days.

(21) Appl. No.: 13/328,346

(22) Filed: Dec. 16, 2011

(65) Prior Publication Data

US 2013/0154060 A1    Jun. 20, 2013

(51) Int. Cl.
*H01L 21/44* (2006.01)

(52) U.S. Cl.
USPC ........... 438/597; 438/633; 438/637; 438/638; 438/703; 438/754; 257/E21.476

(58) Field of Classification Search
None
See application file for complete search history.

(56) References Cited

U.S. PATENT DOCUMENTS 6,239,035 B1 * 5/2001 Harris ........................... 438/703

* cited by examiner

*Primary Examiner* — Kyoung Lee
(74) *Attorney, Agent, or Firm* — Lowe Hauptman & Ham, LLP

(57) ABSTRACT

A wafer including a substrate, a dielectric layer over the substrate, and a conductive layer over the dielectric layer is disclosed. The substrate has a main portion. A periphery of the dielectric layer and the periphery of the main portion of the substrate are separated by a first distance. A periphery of the conductive layer and the periphery of the main portion of the substrate are separated by a second distance. The second distance ranges from about a value that is 0.5% of a diameter of the substrate less than the first distance to about a value that is 0.5% of the diameter greater than the first distance.

20 Claims, 5 Drawing Sheets

WAFER AND METHOD OF PROCESSING WAFER

BACKGROUND

An integrated circuit (IC) chip incorporates millions of active and passive electrical components on a semiconductor substrate within an area usually less than 100 mm². Layers of materials are deposited, implanted, patterned, and/or removed in order to form the active and passive electrical components and interconnection structures of the IC chip. Usually, tens or even hundreds of similar or identical IC chips are arranged to be manufactured on a single wafer for efficient mass production. The larger the wafer size, the more IC chips can be manufactured on a single wafer, and thus the fabrication cost for each IC chip is lower.

On the other hand, an edge portion of the wafer tends to be more vulnerable to various kinds of process variations, such as poor step-coverage when forming a film thereon, trapped voids when filling openings, or damages caused by material exposure, plasma-arcing, or other uniformity issues of the processes. These issues not only result in defective chips at the edge portion of the wafer. The defects, such as cracks or delaminated layers, at the edge portion of the wafer may further propagate inward toward the center of the wafer and thus lead to more defective chips at an inner portion of the wafer.

DESCRIPTION OF THE DRAWINGS

One or more embodiments are illustrated by way of examples, and not by limitation, in the figures of the accompanying drawings, wherein elements having the same reference numeral designations represent like elements throughout and wherein.

DETAILED DESCRIPTION

Figure 1:
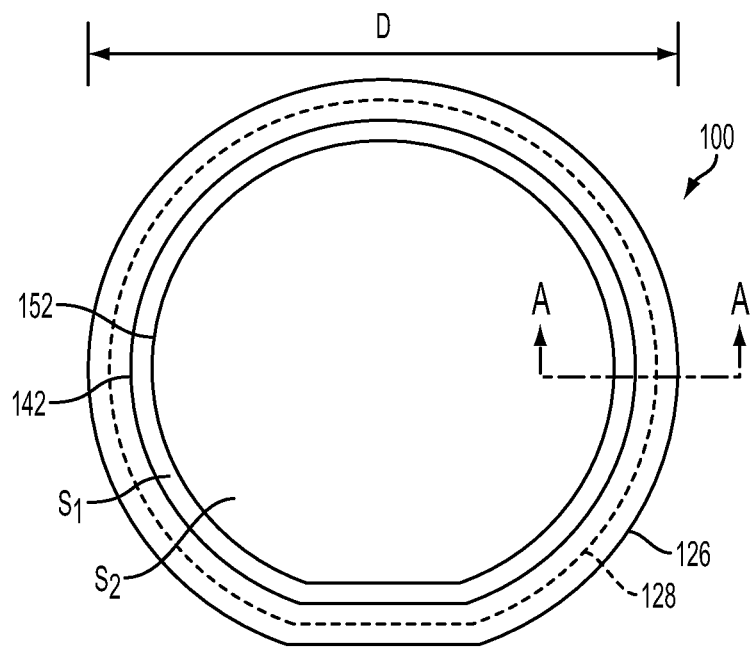
FIG. 1 is a schematic top view of a semiconductor wafer in accordance with one or more embodiments.

It is understood that the following disclosure provides many different embodiments, or examples, for implementing different features of the disclosure. Specific examples of components and arrangements are described below to simplify the present disclosure. These are, of course, examples and are not intended to be limiting. In accordance with the standard practice in the industry, various features in the drawings are not drawn to scale and are used for illustration purposes only.

The formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "below," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

Figure 2:
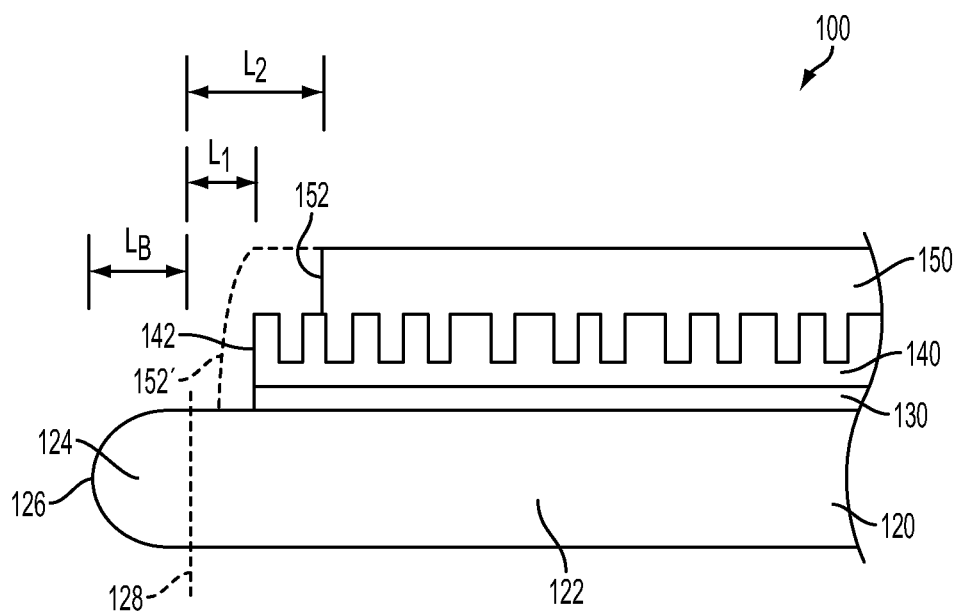
FIG. 2 is cross-sectional view of the semiconductor wafer taken at line A, as depicted in FIG. 1, in accordance with one or more embodiments.

FIG. 1 is a schematic top view of a semiconductor wafer 100 in accordance with one or more embodiments. The wafer 100 has a circular shape having a diameter D. The wafer 100 has at least one notch portion 110 indicative of a lattice orientation of the semiconductor substrate 120 (FIG. 2) of the wafer 100. The wafer 100 is arranged to have a plurality of IC chips (not shown) formed thereon. In at least one embodiment, the diameter D of the wafer is about 12 inches (304.8 mm). In some embodiments, the diameter D of the wafer is greater or less than 304.8 mm, such as 6 inches, 8 inches, or 18 inches. The substrate 120 has a main portion 122 (FIG. 2) and a bevel portion 124 (FIG. 2). The main portion 122 is the flat portion of the substrate 120 and has a substantially constant thickness, and the bevel portion 124 has a tapered shape extending from a periphery 126 of the substrate 120 inward toward a center of the substrate 120 and ending at the main portion 122. The bevel portion 124 is at the edge of the substrate 120 and surrounds the main portion 122, and the interface between the main portion 122 and the bevel portion 124 defines a periphery 128 of the main portion 122.

The wafer 100 also includes a dielectric layer 140 (FIG. 2) over the semiconductor substrate 120 and a conductive layer 150 (FIG. 2) over the dielectric layer 140. The dielectric layer 140 has a circular shape, and a periphery 142 of the dielectric layer 140 defines a dielectric layer area $S_1$. The conductive layer 150 has a circular shape, and a periphery 152 of the conductive layer 150 defines a conductive layer area $S_2$.

FIG. 2 is a cross-sectional view of the wafer 100 taken at line A, as depicted in FIG. 1, in accordance with one or more embodiments. The wafer 100 includes the semiconductor substrate 120, an intermediate structure 130, the dielectric layer 140 over the semiconductor substrate 120 and the intermediate structure 130, and the conductive layer 150 over the dielectric layer 140.

The substrate 120 has a diameter, which is the same as the diameter D (FIG. 1) of the wafer 100. The substrate 120 has the main portion 122 and the bevel portion 124, and the bevel portion 124 extends from the periphery 126 of the substrate 120 inwardly for about a distance $L_B$. The distance $L_B$ is set to be large enough to allow various processing machines to hold the wafer 100 securely, but small enough to maximize an area of the main portion 122 on which a plurality of IC chips will be formed. In some embodiments, the distance $L_B$ is about 1 mm.

In some embodiments, the substrate 120 includes: an elementary semiconductor such as silicon or germanium in crystal, polycrystalline, or an amorphous structure; a compound semiconductor including silicon carbide, gallium arsenide, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In at least one embodiment, the substrate 120 is an alloy semiconductor substrate having a gradient SiGe feature in which the Si and Ge composition change from one ratio at one location to another ratio at another location of the gradient SiGe feature. In another embodiment, the alloy SiGe is formed over a silicon substrate. In yet another embodiment, a SiGe substrate is strained. In some further embodiments, the semiconductor substrate is a semiconductor on insulator. In some examples, the semiconductor substrate includes a doped epitaxial layer or a buried layer. In other examples, the compound semiconductor substrate has a multilayer structure or the substrate includes a multilayer compound semiconductor structure.

The intermediate structure 130 includes a plurality of active or passive electrical components, such as a transistor, e.g., a metal-oxide semiconductor field effect transistor (MOSFET), a resistor, a capacitor, and/or an inductor formed over and, in some embodiments, partially embedded within the substrate 120. In some embodiments, the intermediate structure 130 also includes one or more conductive layers and one or more interlayer dielectric layers formed over the substrate 120 and the electrical components.

The dielectric layer 140, over the substrate 120 and the intermediate structure 130, has a plurality of openings defined therein. The openings include trenches and/or vias that are used for forming conductive lines and conductive via plugs, respectively. The periphery 142 of the dielectric layer 140 and the periphery 128 of the main portion 122 of the substrate 120 are separated by a distance $L_1$. The periphery 142 of the dielectric layer 140 is defined by the outer-most edge of the dielectric layer 140. The periphery 152 of the conductive layer 150 and the periphery 128 of the main portion 122 of the substrate 120 are separated by a distance $L_2$. The periphery 152 of the conductive layer 150 is defined by the outer-most edge of the conductive layer 150. In at least one embodiment, the conductive layer 150 overlays the periphery 142 of the dielectric layer 140 and/or extends over the periphery 142 of the dielectric layer 140 as depicted in FIG. 2 by the dotted line (reference 152' is indicative of the embodiment in which the conductive layer 150 extends), and a gap between the periphery 152' of the conductive layer 150 and the periphery 128 of the main portion 122 is still denoted as the distance $L_2$. The distances $L_1$ and $L_2$ are set to balance a tradeoff between the removal of defective films or patterns caused by non-uniformity or plasma-arcing and a number of IC chips to be formed on the substrate 120. The distances $L_1$ and $L_2$ are set to maximize the number of working IC chips able to be formed on a single wafer 100.

In some embodiments, the distance $L_1$ ranges from about 0.25% of the diameter D to about 0.45% of the diameter D. In some embodiments, the distance $L_2$ ranges from about a value that is 0.5% of the diameter D less than the distance $L_1$ to about a value that is 0.5% of the diameter D greater than the distance $L_1$ (i.e., $L_2$ is equal to or within $L_1$+/−0.005*D). In at least one embodiment, the diameter D is about 12 inches or 304.8 mm, the distance $L_1$ ranges from about 0.7 mm to about 1.3 mm, and the distance $L_2$ ranges from about 1.5 mm greater than the distance $L_1$ (i.e., about 2.2 mm to about 2.8 mm) to about 1.0 mm less than the distance $L_1$ (i.e., about −0.3 mm to about 0.3 mm). The negative value of $L_2$ means that the conductive layer 150 extends beyond the periphery 128 of the substrate 120 and to an upper surface of the bevel portion 124.

In some embodiments, the dielectric layer 140 and the conductive layer 150 are usable to form a portion of the interconnection structure for the IC chip. In at least one embodiment, the interconnection structure includes one upper-most metal layer (i.e., a top metal layer), one or more other metal layers (i.e., inter metal layers), and inter metal dielectric layers for insulating among different conductive paths and mechanically supporting the inter metal layers and the top metal layer. In at least one embodiment where the conductive layer 150 is a top metal layer, the distance $L_2$ ranges from about a value that equals the distance $L_1$ to about the value that is 0.5% of the diameter D less than the distance $L_1$ (i.e., $L_1 \geq L_2 \geq L_1 - 0.005*D$). In at least one embodiment where the conductive layer 150 is an inter metal layer, the distance $L_2$ ranges from about a value that equals the distance $L_1$ to about the value that is 0.5% of the diameter D greater than the distance $L_1$ (i.e., $L_1 \leq L_2 \leq L_1 + 0.005*D$).

In some embodiments, the relationship between the dielectric layer 140, the conductive layer 150, and the distances $L_1$ and $L_2$ are determined according to the relative sizes of the dielectric layer 140 and the conductive layer 150. For example, the dielectric layer 140 defines a dielectric layer area $S_1$ (the area surrounded by the periphery 142 of the dielectric layer 140 as depicted in FIG. 1), and the conductive layer 150 defines a conductive layer area $S_2$ (the area surrounded by the periphery 152 of the conductive layer 150 as depicted in FIG. 1). In some embodiments, the distances $L_1$ and $L_2$ are set such that a ratio of the conductive layer area $S_2$ to the dielectric layer area $S_1$ ranges from about 99.5% to about 110%. In at least one embodiment where the conductive layer 150 is a top metal layer, the ratio of the conductive layer area $S_2$ to the dielectric layer area $S_1$ ranges from about 100% to about 110%. In at least one embodiment where the conductive layer 150 is a inter metal layer, the ratio of the conductive layer area $S_2$ to the dielectric layer area $S_1$ ranges from about 99.5% to about 100%.

In some embodiments, the dielectric layer 140 comprises silicon dioxide or silicon nitride. In some embodiments, the conductive layer 150 comprises copper, aluminum copper, aluminum-copper alloy, silver, gold, silver alloy, gold alloy or combinations thereof.

Figure 3:
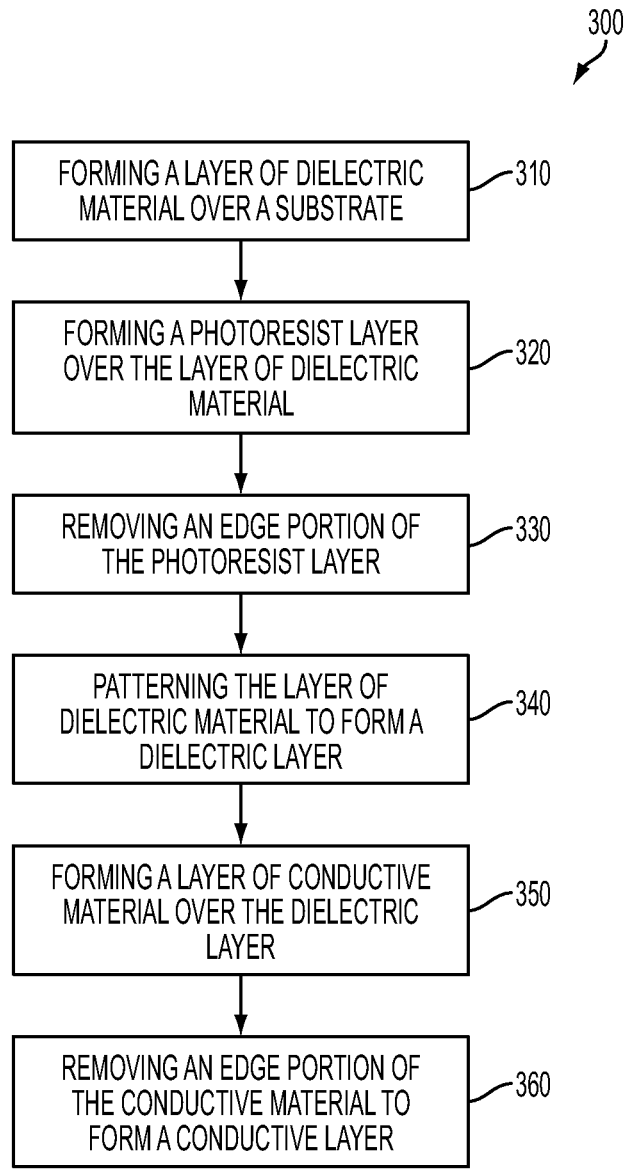
FIG. 3 is a flow chart of a method of manufacturing a semiconductor structure in accordance with one or more embodiments.

FIG. 3 is a flow chart of a method 300 of manufacturing a semiconductor structure (400 in FIGS. 4A-4F) in accordance with one or more embodiments. It is understood that additional processes may be performed before, during, and/or after the method 300 depicted in FIG. 3, and that some other processes may only be briefly described herein.

Figure 4A:
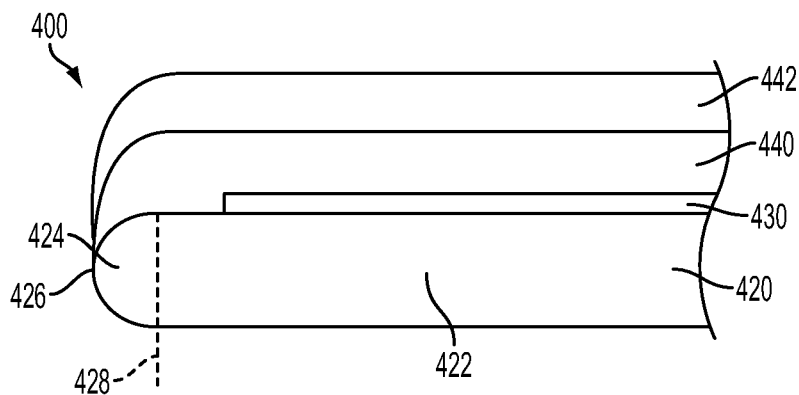
FIGS. 4A-4F are cross-sectional views of a semiconductor structure at various manufacture stages in accordance with one or more embodiments.

In operation 310, a layer of dielectric material (440 in FIG. 4A) is formed over a substrate (420 in FIG. 4A). The substrate 420 has a diameter (D in FIG. 1) as similarly depicted in FIG. 1. The substrate 420 also has a main portion 422 and a bevel portion 424 surrounding the main portion 422 as similarly depicted in FIGS. 1 and 2, and the bevel portion 424 and the main portion 422 define a periphery 428 of the main portion 422 of the substrate 420. In operation 320, a photoresist layer (442 in FIG. 4A) is formed over the layer of dielectric material 440. Then, in operation 330, an edge portion of the photoresist layer 442 is removed to form an edge-processed photoresist layer (444 in FIG. 4B). In some embodiments, the removal of the edge portion of the photoresist layer 454 includes spinning the substrate 420 and spraying a solution at the edge portion of the photoresist layer 442 to etch the edge portion of the photoresist layer 442. In some embodiments, the solution comprises $H_2SO_4$ or $H_2O_2$.

Figure 4B:
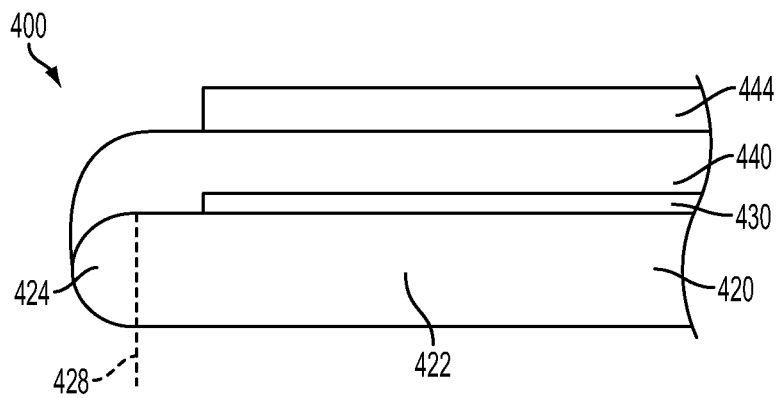
Figure 4C:
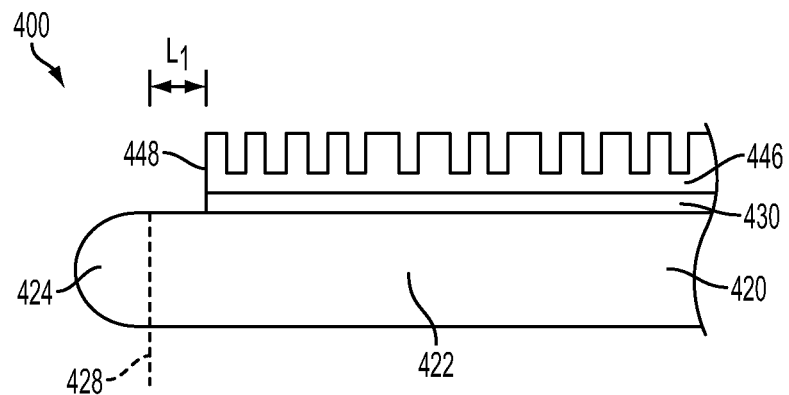

The process moves on to operation 340, where the layer of dielectric material 440 is patterned using the edge-processed photoresist layer 444 to form a patterned dielectric layer (446 in FIG. 4C). Then, the edge-processed photoresist layer 444 is removed by an ashing process. In some embodiments, operations 320, 330, and 340 are repeated until the patterning of the layer of dielectric material 440 is completed. The periphery (448 in FIG. 4C) of the patterned dielectric layer 446 and a periphery 428 of the main portion 422 of the substrate 420 are separated by a first distance $L_1$. In some embodiments, the first distance $L_1$ ranges from about 0.25% of the diameter D to about 0.45% of the diameter D.

The process moves on to operation 350, where a layer of conductive material (450 in FIG. 4D) is formed over the patterned dielectric layer 446. In at least one embodiment, the layer of conductive material 440 comprises a metallic material and is formed by electroplating of the metallic material over the patterned dielectric layer 446. Then, in operation 360, an edge portion of the metallic layer (i.e., the layer of conductive material 450) is removed to form the conductive layer 452. In some embodiments, the removal of the edge portion of the layer of conductive material 450 includes spinning the substrate 420 and spraying a solution at the edge portion of the metallic layer 450 to remove the edge portion of the metallic layer 450. In some embodiments, the solution comprises $H_2SO_4$ or $H_2O_2$. The periphery (454 in FIG. 4D) of the conductive layer 452 and a periphery 428 of the main portion 422 of the substrate 420 are separated by a second distance $L_2$.

In at least one embodiment, the conductive layer 452 is so formed that the second distance $L_2$ ranges from about a value that is 0.5% of the diameter D less than the first distance $L_1$ to about a value that is 0.5% of the diameter D greater than the first distance $L_1$. In at least one embodiment where the conductive layer 452 is a top metal layer, the second distance $L_2$ ranges from about a value that equals the first distance $L_1$ to about the value that is 0.5% of the diameter D less than the first distance $L_1$. In at least another embodiment where the conductive layer 452 is an inter metal layer, the second distance $L_2$ ranges from about a value that equals the first distance $L_1$ to about the value that is 0.5% of the diameter D greater than the first distance $L_1$. In at least one embodiment where the conductive layer 452 is a top metal layer, operation 360 is indeed omitted.

In some embodiments, the relationship between the dielectric layer 446, the conductive layer 452, and the distances L1 and L2 is determined according to their relative sizes. For example, the dielectric layer 446 defines a dielectric layer area ($S_1$ in FIG. 1) and the conductive layer 452 defines a conductive layer area ($S_2$ in FIG. 1). In some embodiments, a ratio of the conductive layer area $S_2$ to the dielectric layer area $S_1$ ranges from about 99.5% to about 110%. In at least one embodiment where the conductive layer 452 is a top metal layer, the ratio of the conductive layer area $S_2$ to the dielectric layer area $S_1$ ranges from about 100% to about 110%. In at least one embodiment where the conductive layer 452 is a inter metal layer, the ratio of the conductive layer area $S_2$ to the dielectric layer area $S_1$ ranges from about 99.5% to about 100%. In other words, in an embodiment where the conductive layer 452 is a top metal layer, the conductive layer 452 is formed to overlay the periphery 448 of the patterned dielectric layer 446; and in an embodiment where the conductive layer 452 is an inter metal layer, and the conductive layer 452 is formed to expose the periphery 448 of the patterned dielectric layer 446.

Other operations are subsequently performed to complete the fabrication of the IC chip on the wafer 100. For example, in some embodiments, the conductive layer 150 is subsequently planarized using a Chemical Mechanical Planarization (CMP) process, and one or more passivation layers and bump structures are formed thereon.

FIGS. 4A-4F are cross-sectional views of a semiconductor structure 400 at various manufacture stages in accordance with one or more embodiments.

As depicted in FIG. 4A, the semiconductor structure 400 has a substrate 420, an intermediate structure 430 over the substrate 420, a layer of dielectric material 440 over the semiconductor substrate 420 and the intermediate structure 430, and a photoresist layer 442 over the layer of dielectric material 440. The substrate 420 is usable as the substrate 120 of the wafer 100 depicted in FIG. 1 and has a diameter, which is the same as the diameter D of the wafer 100 as depicted in FIG. 1. The substrate 420 has a main portion 422 and a bevel portion 424. The main portion 422 has a substantially constant thickness, and the bevel portion 424 has a tapered shape extending from a periphery 426 of the substrate 420 inwardly. The intermediate structure 430 corresponds to the intermediate structure 130 of the wafer 100 and includes a plurality of active or passive electrical components.

The layer of dielectric material 440 is formed over the intermediate structure 430 and the substrate 420. (Operation 310). In some embodiments, the layer of dielectric material 440 comprises silicon dioxide or silicon nitride. The layer of dielectric material 440 is formed by performing a chemical vapor deposition (CVD) process, an atomic layer deposition (ALD) process, a thermal oxidation process, a furnace process, other deposition processes, or combinations thereof. The photoresist layer 442 is then formed over the layer of dielectric material 440 by spin-coating or other suitable process. (Operation 320).

As depicted in FIG. 4B, an edge portion of the photoresist layer 442 is removed to form an edge-processed photoresist layer 454. (Operation 330). The edge-processed photoresist layer 444 is then patterned by a lithography process. Then, as depicted in FIG. 4C, using the patterned photoresist layer 444, the layer of dielectric material 440 is patterned to form a patterned dielectric layer 446. The edge-processed photoresist layer 444 is subsequently removed by an ashing process. (Operation 340). In at least one embodiment, in order to form openings with various widths and depths for the formation of trenches and/or vias, another photoresist layer is then formed over the patterned dielectric layer 446, and operations 320-340 are repeated until the patterning of the layer of the dielectric material 440 is completed.

Figure 4D:
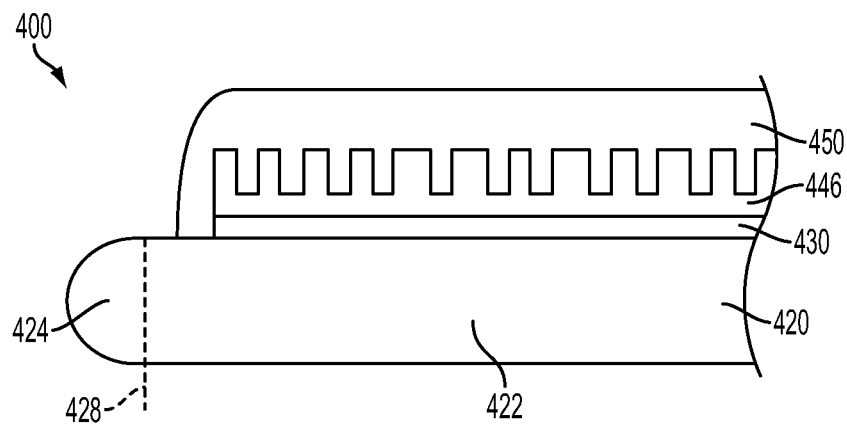
Figure 4E:
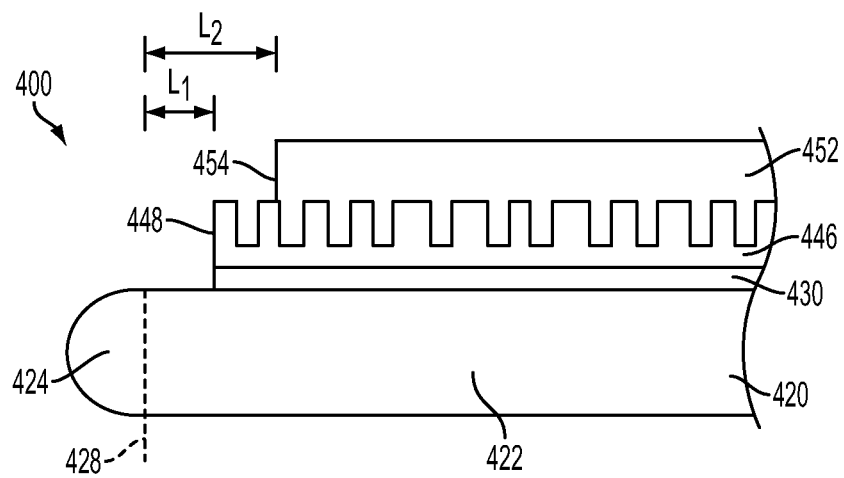

As depicted in FIG. 4D, a layer of conductive material 450 is formed over the patterned dielectric layer 446. (Operation 350). In some embodiments, the layer of conductive material 450 comprises a metallic material such as copper, aluminum, aluminum-copper alloy, silver, gold, silver alloy, gold alloy, or combinations thereof. In at least one embodiment, the layer of conductive material 450 is formed by electroplating of the metallic material. Then, as depicted in FIG. 4E, an edge portion of the layer of conductive material 450 is removed to form a conductive layer 452. In at least one embodiment where the conductive layer 452 is a top metal layer, operation 360 is omitted.

The periphery 448 of the dielectric layer and the periphery 428 of the main portion 422 of the substrate 420 are separated by a first distance $L_1$. A periphery 454 of the conductive layer 455 and the periphery 428 of the main portion 422 of the substrate 420 are separated by a second distance $L_2$. In some embodiments, the first distance $L_1$ ranges from about 0.25% of the diameter D to about 0.45% of the diameter D. In some embodiments, the second distance $L_2$ ranges from about a value that is 0.5% of the diameter D less than the first distance $L_1$ to about a value that is 0.5% of the diameter D greater than the first distance $L_1$.

In some embodiments, the relationship between the first distance $L_1$ and the second distance $L_2$ is determined according to the relative sizes of the dielectric layer 446 and the conductive layer 452. For example, the dielectric layer 446 defines a dielectric layer area ($S_1$ in FIG. 1), and the conductive layer 452 defines a conductive layer area ($S_2$ in FIG. 1). In some embodiments, the first distance $L_1$ and the second distance $L_2$ are so determined that a ratio of the conductive layer area $S_2$ to the dielectric layer area $S_1$ ranges from about 99.5% to about 110%. In at least one embodiment where the conductive layer 452 is a top metal layer, the ratio of the conductive layer area $S_2$ to the dielectric layer area $S_1$ ranges from about 100% to about 110%. In at least one embodiment where the conthe conductive layer 452 is a inter metal layer, the ratio of the conductive layer area $S_2$ to the dielectric layer area $S_1$ ranges from about 99.5% to about 100%.

Figure 4F:
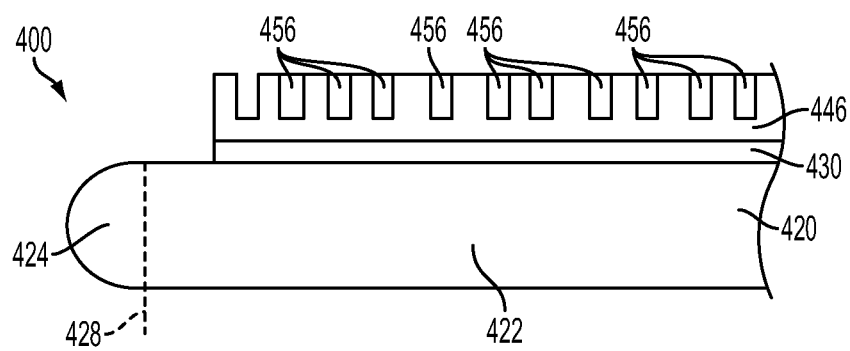

As depicted in FIG. 4F, other operations are subsequently performed to complete the fabrication of the IC chip on the wafer 100. For example, in some embodiments, the conductive layer 452 is subsequently planarized using a CMP process to form conductive lines and via plugs 456, and one or more passivation layers and bump structures are formed thereon.

Figure 5:
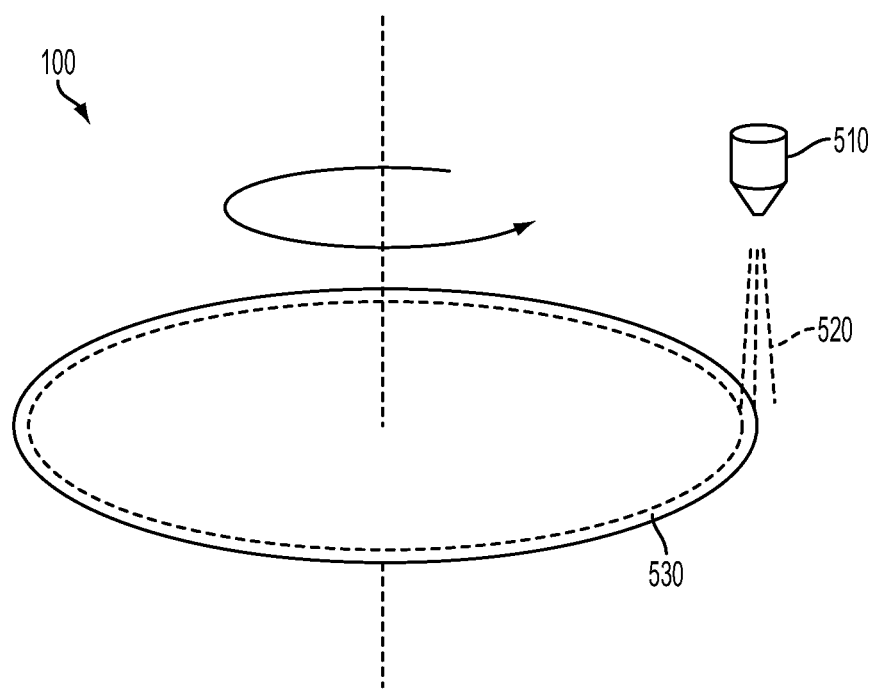
FIG. 5 is a schematic perspective view of an example of the removal of an edge portion of a photoresist layer or a layer of conductive material formed over a substrate in accordance with one or more embodiments.

FIG. 5 is a schematic perspective view of an example of the removal of an edge portion of a photoresist layer 442 or a layer of conductive material 450 formed over a substrate 420 in accordance with one or more embodiments.

In at least one embodiment for removing the edge portion of the photoresist layer 442, the substrate 420 of the wafer 100 is placed on a chuck table and spun by driving a motor of the chuck table. A nozzle 510 is placed over the wafer 100 and sprays a solution 520 onto the wafer 100 at the edge portion 530 of the wafer 100, and thus to etch the edge portion of the photoresist layer 442. In some embodiments, the solution 520 used to remove the edge portion of the photoresist layer 442 comprises $H_2SO_4$ or $H_2O_2$.

In at least one embodiment for removing the edge portion of the layer of conductive material 450, the substrate 420 of the wafer 100 is placed on the chuck table for spinning by the motor of the chuck table. The nozzle 510 is placed over the wafer 100 and sprays a solution 520 onto the wafer 100 at the edge portion 530 of the wafer 100, and thus to etch the edge portion of the layer of conductive material 450. In some embodiments, the solution 520 used to remove the edge portion of the layer of conductive material 450 comprises $H_2SO_4$ or $H_2O_2$.

In accordance with some embodiments, a wafer includes a substrate, a dielectric layer over the substrate, and a conductive layer over the dielectric layer. The substrate has a main portion having a substantially constant thickness. A periphery of the dielectric layer and a periphery of the main portion being separated by a first distance, and a periphery of the conductive layer and the periphery of the main portion being separated by a second distance. The second distance ranges from about a value that is 0.5% of a diameter of the substrate less than the first distance to about a value that is 0.5% of the diameter of the substrate greater than the first distance.

In accordance with some embodiments, a method of forming a semiconductor structure is disclosed. According to the method, a layer of dielectric material is formed over a substrate, and the substrate has a main portion. A photoresist layer is formed over the layer of dielectric material. An edge portion of the photoresist layer is removed to form an edge-processed photoresist layer. The layer of dielectric material is patterned based on the edge-processed photoresist layer to form a patterned dielectric layer. A periphery of the patterned dielectric layer and a periphery of the main portion of the substrate are separated by a distance. A conductive layer is formed over the patterned dielectric layer. A periphery of the conductive layer is formed within about 0.5% of a diameter of the substrate to the periphery of the patterned dielectric layer.

In accordance with some embodiments, a method of processing a wafer having a substrate is disclosed. The substrate has a main portion. A dielectric layer is formed over the substrate. The dielectric layer has a periphery and defines a dielectric layer area, and the periphery of the dielectric layer and a periphery of the main portion of the substrate are separated by a distance ranging from about 0.25% to about 0.45% of a diameter of the substrate. A conductive layer is formed over the dielectric layer, and the conductive layer defines a conductive layer area. A ratio of the conductive layer area to the dielectric layer area ranging from about 99.5% to about 110%.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor structure, comprising:
    forming a layer of dielectric material over a substrate, the substrate having a main portion, and the main portion having a substantially constant thickness;
    forming a photoresist layer over the layer of dielectric material;
    removing an edge portion of the photoresist layer to form an edge-processed photoresist layer;
    patterning the layer of dielectric material based on the edge-processed photoresist layer to form a patterned dielectric layer, a periphery of the patterned dielectric layer and a periphery of the main portion of the substrate being separated by a distance;
    forming a conductive layer over the patterned dielectric layer, a periphery of the conductive layer being within about 0.5% of a diameter of the substrate to the periphery of the patterned dielectric layer.

2. The method of claim 1, wherein the removal of the edge portion of the photoresist layer comprises:
    spinning the substrate; and
    spraying a solution at the edge portion of the photoresist layer to etch the edge portion of the photoresist layer.

3. The method of claim 2, wherein the solution comprises $H_2SO_4$ or $H_2O_2$.

4. The method of claim 1, wherein the formation of the conductive layer comprises:
    electroplating a metallic layer over the patterned dielectric layer; and
    removing an edge portion of the metallic layer to form the conductive layer.

5. The method of claim 4, wherein the removal of the edge portion of the metallic layer comprises:
    spinning the substrate; and
    spraying a solution at the edge portion of the metallic layer to remove the edge portion of the metallic layer.

6. The method of claim 5, wherein the solution comprises $H_2SO_4$ or $H_2O_2$.

7. The method of claim 1, wherein the conductive layer is a top metal layer, and the conductive layer is formed to overlay the periphery of the patterned dielectric layer.

8. The method of claim 1, wherein the conductive layer is an inter metal layer, and the conductive layer is formed to expose the periphery of the patterned dielectric layer.

9. A method of processing a wafer including a substrate, the substrate having a flat portion, the method comprising:
    forming a dielectric layer over the substrate, the dielectric layer having a dielectric layer area, and a periphery of the dielectric layer and a periphery of the flat portion of the substrate being separated by a distance ranging from about 0.25% to about 0.45% of a diameter of the substrate; and forming a conductive layer over the dielectric layer, the conductive layer having a conductive layer area, a ratio of the conductive layer area to the dielectric layer area ranging from about 99.5% to about 110%.

10. The method of claim 9 wherein the formation of the dielectric layer comprises:

forming a layer of dielectric material over the substrate;

forming a photoresist layer over the layer of dielectric material;

spinning the substrate; and spraying a solution at an edge portion of the photoresist layer to remove the edge portion of the photoresist layer.

11. The method of claim 10, wherein the solution comprises $H_2SO_4$ or $H_2O_2$.

12. The method of claim 9, wherein the formation of the conductive layer comprises:

electroplating a metallic layer over the dielectric layer;

spinning the substrate; and spraying a solution at an edge portion of the metallic layer to remove the edge portion of the metallic layer.

13. The method of claim 12, wherein the solution comprises $H_2SO_4$ or $H_2O_2$.

14. The method of claim 9, wherein the conductive layer is a top metal layer, and the ratio of the conductive layer area to the dielectric layer area ranging from about 100% to about 110%.

15. A method of forming a semiconductor structure, comprising:

forming a layer of dielectric material over a substrate, the substrate having a main portion and a periphery portion, the main portion having a substantially constant thickness, and the periphery portion having a beveled edge;

patterning the layer of dielectric material to form a patterned dielectric layer, an outer edge of the patterned dielectric layer separated from the periphery of the substrate by a first distance;

forming a conductive layer over the patterned dielectric layer, wherein a ratio of a top surface area of the conductive layer to a top surface area of the patterned dielectric layer ranges from about 99.5% to about 110%.

16. The method of claim 15, wherein the ratio of the top surface area of the conductive layer to the top surface area of the patterned dielectric layer ranges from about 99.5% to about 100% if the conductive layer is an inter metal layer.

17. The method of claim 15, wherein the ratio of the top surface area of the conductive layer to the top surface area of the patterned dielectric layer ranges from about 100% to about 110% if the conductive layer is a top metal layer.

18. The method of claim 15, further comprising patterning the conductive layer to form a patterned conductive layer, an outer edge of the patterned conductive layer separated from the periphery of the substrate by a second distance, wherein the second distance is within 0.5% of a diameter of the substrate from the first distance.

19. The method of claim 18, wherein the second distance ranges from a value equal to the first distance to a value 0.5% of the diameter of the substrate less than the first distance if the patterned conductive layer is a top metal layer.

20. The method of claim 18, wherein the second distance ranges from a value equal to the first distance to a value 0.5% of the diameter of the substrate greater than the first distance if the patterned conductive layer is an inter metal layer.

* * * * *